(12) United States Patent
Yoo et al.

(10) Patent No.: US 9,422,460 B2
(45) Date of Patent: Aug. 23, 2016

(54) ADHESIVE FILM

(71) Applicant: LG CHEM, LTD., Seoul (KR)

(72) Inventors: Hyun Jee Yoo, Daejeon (KR); Suk Ky Chang, Daejeon (KR); Jung Sup Shim, Daejeon (KR); Yoon Gyung Cho, Daejeon (KR); Seung Min Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 126 days.

(21) Appl. No.: 14/268,883

(22) Filed: May 2, 2014

(65) Prior Publication Data

US 2015/0284595 A1 Oct. 8, 2015

Related U.S. Application Data

(63) Continuation of application No. PCT/KR2012/009621, filed on Nov. 14, 2012.

(30) Foreign Application Priority Data

Nov. 14, 2011 (KR) .................. 10-2011-0118477
Nov. 14, 2011 (KR) .................. 10-2012-0128959

(51) Int. Cl.
*C09J 7/00* (2006.01)
*B32B 37/12* (2006.01)
*H01L 51/52* (2006.01)
*C09J 163/00* (2006.01)

(52) U.S. Cl.
CPC . *C09J 7/00* (2013.01); *B32B 37/12* (2013.01); *B32B 2457/00* (2013.01); *C09J 163/00* (2013.01); *C09J 2203/318* (2013.01); *C09J 2203/326* (2013.01); *C09J 2400/10* (2013.01); *C09J 2463/00* (2013.01); *C09J 2471/00* (2013.01); *H01L 51/5246* (2013.01); *Y10T 156/10* (2015.01); *Y10T 428/2457* (2015.01)

(58) Field of Classification Search
CPC ....................................................... B32B 5/26
USPC ................................................................ 428/76
See application file for complete search history.

(56) References Cited

U.S. PATENT DOCUMENTS

| 5,208,103 | A | 5/1993 | Miyamoto et al. |
| 6,808,828 | B2 | 10/2004 | Ohata |
| 6,936,131 | B2 | 8/2005 | McCormick et al. |
| 8,846,169 | B2 | 9/2014 | McCormick et al. |
| 2003/0143423 | A1 | 7/2003 | McCormick et al. |
| 2006/0172104 | A1* | 8/2006 | Lim ........... C09J 7/0207 428/40.1 |
| 2008/0202682 | A1 | 8/2008 | Husemann et al. |
| 2011/0229694 | A1 | 9/2011 | Kanda |

FOREIGN PATENT DOCUMENTS

| CN | 1942547 | 4/2007 |
| CN | 101151343 | 3/2008 |
| JP | 05-032288 | 2/1993 |
| JP | 2003-142257 A | 5/2003 |
| JP | 2005-516369 A | 6/2005 |
| JP | 2009-187857 A | 8/2009 |

(Continued)

*Primary Examiner* — Brent O'Hern
(74) *Attorney, Agent, or Firm* — Dentons US LLP

(57) ABSTRACT

Provided is an adhesive film capable of being used to encapsulate or capsulate an OED. The adhesive film includes an adhesive layer whose surface has at least one groove for exhausting air.

11 Claims, 3 Drawing Sheets

(56) References Cited

FOREIGN PATENT DOCUMENTS

| | | |
|---|---|---|
| JP | 2010-13648 A | 1/2010 |
| JP | 2011-508062 A | 3/2011 |
| KR | 10-2007-0116969 | 12/2007 |
| KR | 10-2010-0004869 | 1/2010 |
| KR | 10-2010-0112142 | 10/2010 |
| TW | 201132729 A1 | 10/2011 |
| WO | 2009/086095 | 7/2009 |

* cited by examiner

ADHESIVE FILM

This application is a Continuation Bypass of International Application PCT/KR2012/009621, with an international filing date of Nov. 14, 2012, which claims priority to and the benefit of Korean Patent Application No. 10-2011-0118477, filed on Nov. 14, 2011, and Korean Patent Application No. 10-2012-0128959, filed on Nov. 14, 2012, all of which are incorporated herein by reference in their entirety.

FIELD

The present application relates to an adhesive film, a method of capsulating an organic electronic device, an organic electronic device, an organic electroluminescence display, and a light.

BACKGROUND

An organic electronic device (OED) refers to a device including at least one layer of an organic material capable of conducting current, and may include a photovoltaic device, a rectifier, a transmitter and an organic light emitting diode (OLED).

Since an OED is generally vulnerable to external factors such as water, an encapsulated structure is usually required to protect the OED.

For example, in the patent documents 1 to 4, to protect an OED from an external environment such as water, an encapsulated structure in which an OED formed on a substrate is covered with a glass can or metal can equipped with a getter or water absorbent, and fixed with an adhesive is disclosed.

PRIOR ART DOCUMENTS (Patent document 1) U.S. Pat. No. 6,226,890
(Patent document 2) U.S. Pat. No. 6,808,828
(Patent document 3) Japanese Patent Laid-Open No. 2000-145627
(Patent document 4) Japanese Patent Laid-Open No. 2001-252505

DETAILED DESCRIPTION

Technical Object

The object of the present application is to provide an adhesive film, a method of capsulating an OED, an OED, a liquid crystal display and a light.

Technical Solution

Illustrative adhesive film may include an adhesive layer. At least one groove for exhausting air may be formed on a surface of the adhesive layer. FIG. 1 is a diagram of an adhesive layer of an illustrative adhesive film 1, showing the adhesive layer 12 whose surface has at least one groove 11.

The adhesive film may be used to capsulate an OED. For example, the adhesive film may be used to form a capsulated structure of the OED by coating an entire surface of the OED with the adhesive layer to adhere to the OED.

For example, the adhesive layer may be laminated to coat the entire surface of the OED such that a surface of the adhesive layer having the groove faces the OED. Here, air bubbles captured during the lamination may be exhausted to the outside through the groove formed on the surface of the adhesive layer. In addition, the groove may be eliminated due to heat ore pressure applied in the lamination by controlling a size of the groove and characteristics of the adhesive layer, and a space formed by the groove may be filled, thereby finally forming the capsulated structure of the OED having excellent durability.

The term "organic electronic device (OED)" may include a product, diode or device including at least one organic material capable of conducting current, including, for example, a photovoltaic device, a rectifier, a transmitter and an organic light emitting diode (OLED), but the present application is not limited thereto. In one example, the OED may be an OLED.

A width and height of the groove formed on the surface of the adhesive layer is not particularly limited as long as the width and height of the groove can be controlled so that the groove can serve to suitably exhaust air during lamination and can be suitably eliminated due to heat or pressure. For example, a width of the groove of the adhesive layer may be approximately 20 μm to 1 mm, 50 μm to 1 mm, or 50 to 700 μm. In addition, a height of the groove of the adhesive layer may be approximately 1 to 10 μm. Here, when the adhesive layer has one groove, the width and height may refer to the height and width of the groove, or, when the adhesive layer has at least two grooves, the width and height may refer to an average height and width of at least two grooves.

When the width and height of the groove are controlled as described above, air bubbles captured during the lamination and capsulation may be suitably exhausted, and it may prevent penetration of external materials through remaining grooves in the finally formed capsulated structure.

A cross-section of the groove of the adhesive layer may have various shapes such as a rectangular shape as shown in FIG. 1, a polygonal shape such as a triangular or pentagonal shape, a U shape or amorphous shape, but the present application is not limited thereto.

In one example, at least two grooves may be formed on the surface of the adhesive layer. The plurality of grooves may be connected to each other. FIG. 2 is a diagram showing a surface of an illustrative adhesive layer 2 including a plurality of grooves 11 connected to each other. As shown in FIG. 2, the grooves 11 may be formed on an entire surface of an adhesive surface 12 of the adhesive layer, thereby creating paths connected to each other.

When the plurality of grooves are formed on the surface of the adhesive layer, a gap between the grooves may be, for example, approximately 100 μm to 5 mm. As the gap between the grooves is controlled as described above, air bubbles capture during lamination and capsulation may be suitably exhausted, and it may prevent penetration of an external material through a groove remaining in a finally formed capsulated structure.

To ensure air bubble exhausting performance and durability in the final capsulated structure, a kind of grooves having substantially the same height and width, or at least two kinds of grooves having different heights and/or widths may be formed on the adhesive layer.

For example, on the surface of the adhesive layer, a first groove for exhausting air having a predetermined height and width and a second groove for exhausting air having a larger height or width than the first groove for exhausting air may be formed. For example, the first groove for exhausting air may have a width of approximately 20 μm to 1 mm, and a height of approximately 1 to 10 μm. The second groove for exhausting air may be controlled to have the height and width larger than any one or both of those of the first groove for exhausting air. For example, the width and height of the second groove for exhausting air may be controlled differently from those of the first groove for exhausting air within the above range of the width and height of the first groove for exhausting air. The first and second grooves for exhausting air having the above dimensions may be connected to each other. As the first and second grooves for exhausting air are formed, the first groove for exhausting air may deliver captured air bubbles to the second groove for exhausting air during a vacuum lamination process in the formation of a capsulated structure, and then may be eliminated in a relatively short time, thereby ensuring durability. In addition, since the grooves may have sequential heights, the grooves formed in the adhesive layer may be more efficiently filled by hot melting in a thermal lamination process.

In one example, at least two of the second grooves for exhausting air are formed on the surface of the adhesive layer, and the first groove for exhausting air may be connected with the second groove for exhausting air between the least two of the second grooves for exhausting air. For example, at least two of each of the first and second grooves for exhausting air may be formed on the surface of the adhesive layer, a gap between the second grooves for exhausting air may be wider than that between the first grooves for exhausting air, and the first grooves for exhausting air may be formed between two adjacent grooves of the second grooves for exhausting air. Accordingly, a capsulated structure exhausting captured air bubbles in a short time and finally having excellent durability may be formed.

A thickness of the adhesive layer may be particularly limited, and may be suitably controlled in a range in which the groove for exhausting air described above may be suitably formed, and the durability of the capsulated structure may be finally ensured.

For example, the adhesive layer having a groove for exhausting air on a surface thereof may be formed by coating an adhesive (coating solution) to be described later on a base having an embossed form on a surface thereof, for example, a release film. FIG. 4 is a schematic diagram of an adhesive layer 12 formed by coating an adhesive on a base layer 42 having an embossed form 41 on a surface thereof.

The base layer 42 may be, for example, formed by forming an embossment by rolling a release film having polyethylene, polypropylene or a silicon resin formed on a surface thereof using an embossing roll. In addition, to form a multi-layered structure as will be described later, adhesive layers may first be formed and then stacked, or adhesive layers may be sequentially formed by coating and drying another adhesive on a previously formed adhesive layer.

The adhesive layer may be formed in a multi-layered structure. When the adhesive layer has a multi-layered structure, the above-descried groove for exhausting air may be formed on a surface of the outmost adhesive layer of sub-adhesive layers constituting the multi-layered structure.

FIG. 3 shows an illustrative adhesive layer 3 formed in a multi-layered structure including a first adhesive layer 12 having a groove for exhausting air 11 on a surface thereof and a second adhesive layer 31 stacked on the first adhesive layer 12.

As to be described later, the adhesive layer may include a water absorbent. When the adhesive layer has the multi-layered structure as described above, a water absorbent may be included only in an adhesive layer not having a groove for exhausting air on a surface thereof among sub-adhesive layers having a multi-layered structure. For example, as shown in FIG. 3, when the first and second adhesive layers 12 and 13 are included, the first adhesive layer may not include a water absorbent, but the second adhesive layer may include a water absorbent.

A total thickness of the adhesive layer formed in a multi-layered structure is not particularly limited. In one example, the adhesive layer may have a total thickness of 8, 10, 15, 20, 25 or 30 µm or more. In addition, the upper limit of the total thickness may be, for example, 200, 190, 180, 170, 160, 150, 140, 130, 120, 110, 100, 90, 80, 70, 60, 50, 45, 40, 35 or 30 µm or less.

The adhesive layer may be formed in the form of a film or sheet, for example, a hot melt-type film or sheet. The term "hot melt-type adhesive layer" may refer to an adhesive layer which is formed in a solid or semi-solid film or sheet at room temperature, exhibits a pressure-sensitive adhesive property when melted by heating, and serves as an adhesive to tightly fix a target subject after cured. The term "curing" used herein may refer to a chemical or physical action or reaction by changing an adhesive layer to exhibit an adhesive property. In addition, the term "room temperature" may refer to a temperature in a natural environment, not increased or decreased. The room temperature may be approximately 15 to 35° C., 20 to 25° C., 25° C. or 23° C.

The adhesive layer of the adhesive film may have a groove for exhausting air on a surface thereof, and may be in a solid or semi-solid uncured state before a capsulation process is applied. The adhesive layer may be cured during capsulation to form a crosslinking structure.

The fact that the adhesive layer is in a solid or semi-solid at room temperature may refer to a state in which the adhesive layer has a viscosity at room temperature of approximately $10^6$ to $10^9$ or $10^7$ to $10^9$ poises. The viscosity may be measured using an advanced rheometric expansion system (ARES). As the adhesive layer is present in a solid or semi-solid phase at room temperature, a physical or chemical damage to the OED can be prevented during the capsulation, and the capsulation process may be smoothly executed. In addition, in the capsulation of the OED, mixing with air bubbles or a decrease in lifespans of the OED may be prevented.

In addition, the adhesive layer may have a water vapor transmission rate (WVTR) after curing of 50, 30, 20 or 15 g/m²·day or less. The WVTR may be a transmission rate of the film-shaped layer, which is obtained by curing the adhesive layer and has a thickness of 80 µm, in a thickness direction, wherein the transmission rate is obtained by measuring the film-shaped layer at 38° C. and a relative humidity of 100%. The WVTR may be measured according to ASTM F1249.

To provide the adhesive layer with the above WVTR, as the same kind of a curable resin to be described later is used, or an amount of a curing agent, crosslinking agent or initiator to be used is controlled, a crosslinking structure or density of the curable resin may be controlled. When the adhesive layer has the above WVTR, it can effectively prevent penetration of water, vapor or oxygen into the capsulated structure of an OED. As the WVTR is lower, an encapsulated structure exhibits excellent performance, and thus the lower limit of the WVTR is not particularly limited.

The adhesive layer may include a curable resin. As the curable resin, a heat-curable, active energy ray-curable or hybrid curable resin known in the related art may be used. The term "heat-curable resin" may refer to a resin capable of being cured through suitable application of heat or an aging process, the term "active energy ray-curable resin" may refer to a resin capable of being cured by radiation of active energy rays, and the term "hybrid-curable resin" may refer to a resin capable of being cured by simultaneous or sequential curing mechanisms of heat- and active energy ray-curable resins. In addition, as the active energy rays, microwaves, IR rays, UV rays, X rays and gamma rays, or particle beams such as alpha-particle beams, proton beams, neutron beams and electron beams may be used.

The curable resin is, for example, a resin capable of being cured to exhibit an adhesive property, and may be a resin including at least one functional group or site, which can take part in a curing process by application of heat, such as a glycidyl group, an isocyanate group, a hydroxyl group, a carboxyl group or an amide group, or at least one functional group or site, which can take part in a curing process by radiation of active energy rays, such as an epoxide group, a cyclic ether group, a sulfide group, an acetal group and a lactone group. The curable resin may be an acryl resin, a polyether resin, an isocyanate resin or an epoxy resin including the at least one functional group or site, but the present application is not limited thereto.

An epoxy resin may be used as the curable resin. The epoxy resin may be an aromatic or aliphatic epoxy resin. The epoxy resin may be a heat-curable epoxy resin, or an active energy ray-curable resin, for example, an epoxy resin cured by a cationic polymerization reaction by radiation of an active energy ray.

The epoxy resin according to an example may have an epoxy equivalent of 150 to 3,000 g/eq. Within the above range of an epoxy equivalent, characteristics such as adhesive performance or a glass transition temperature of a cured product may be maintained in a suitable range. The epoxy resin may be one or a mixture of at least two of a cresol novolac epoxy resin, a bisphenol F-type epoxy resin, a bisphenol F-type novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin and a dicyclopentadiene-modified phenol-type epoxy resin.

In one example, the epoxy resin may be an aromatic epoxy resin. The term "aromatic epoxy resin" may refer to an epoxy resin including at least one of an aromatic core such as a phenylene structure or an aromatic group such as a phenyl group at a main or side chain of the resin. When the aromatic epoxy resin is used, the cured product may have excellent thermal and chemical stabilities, and low water absorption, thereby enhancing reliability of the encapsulated structure of an OED. The aromatic epoxy resin may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin and an alkyl-modified triphenolmethane epoxy resin.

The adhesive layer may include the above-described water absorbent when necessary. The term "water absorbent" may include all kinds of components capable of adsorbing or removing water or vapor input from an external environment, or inhibiting the input thereof through a physical or chemical reaction.

The water absorbent may be, for example, an oxide or metal salt. Here, the oxide may be a metal oxide such as lithium oxide ($Li_2O$), sodium oxide ($Na_2O$), barium oxide (BaO), calcium oxide (CaO) or magnesium oxide (MgO), an organic metal oxide, or phosphorous pentoxide ($P_2O_5$). The metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present application is not limited thereto. In one example, the water absorbent may be a metal oxide, but the present application is not limited thereto.

A shape of the water absorbent is not particularly limited, and may be, for example, spherical, oval, polygonal or amorphous. In addition, for example, the water absorbent may have an average diameter of approximately 50 nm to 20 μm, or 100 nm to 7 μm. Within the above diameter range, water may be suitably blocked or removed, an encapsulating process may be smoothly performed, and an OED may not be damaged during or after encapsulation.

The water absorbent is suitably processed, and then included in the adhesive layer. For example, before the water absorbent is blended to the adhesive layer, it may be applied to a grinding process to control a diameter. To grind the water absorbent, a 3-roll mill, bead mill or ball mill may be used. In addition, when the adhesive is used to encapsulate a top-emission type OED, in consideration of a transmittivity of the adhesive layer, a size of the water absorbent may be controlled in a smaller range.

The adhesive may include the water absorbent at 1 to 100, 1 to 90, 1 to 80, 1 to 70, 1 to 60, 1 to 50, 1 to 40, 5 to 40, 10 to 40 or 15 to 40 parts by weight with respect to 100 parts by weight of the curable resin. As the content of the water absorbent is controlled to 1 part by weight or more, the cured product may have an excellent water and vapor blocking property. In addition, as the content of the water absorbent is controlled to 100 parts by weight or less, an adhesive performance may be realized, an encapsulation layer may be thinly formed, and an excellent water blocking property may be exhibited. When the adhesive layer has a multi-layered structure, a ratio of the curable resin which is the basis of the ratio of the water absorbent may be, for example, a ratio of the curable resin in the entire multi-layered structure or a ratio of the curable resin included in the adhesive layer not having a groove for exhausting air.

Unless specifically defined otherwise herein, the unit "parts by weight" refers to a weight ratio.

The adhesive may further include a filler. The filler may be, for example, an inorganic filler. The filler may inhibit penetration of water or vapor by extending a traveling path of water or vapor penetrated into the capsulated structure. In addition, the filler may maximize the blocking property to water and vapor through the crosslinking structure of the curable resin and an interaction with the water absorbent.

The filler may be one or a mixture of at least two of clay such as nanoclay, talc, silica such as needle-like silica, alumina and titania. In one example, the filler is preferably nanoclay, talc or needle-like silica. In one example, the filler is more preferably clay such as nanoclay.

The clay may be, for example, natural or synthetic clay, organically modified clay such as organoclay.

The natural or synthetic clay may be, but is not limited to, mica, fluoromica, pyrophyllite, glauconite, vermiculite, sepiolite, allophone, imogolite, talc, illite, sobockite, svinfordite, kaolinite, dickite, nacrite, anauxite, sericite, ledikite, montronite, metahalloysite, serpentine clay, chrysotile, antigorite, attapulgite, palygorskite, Kibushi clay, gairome clay, hisingerite, chlorite, montmorillonite, sodium montmorillonite, magnesium montmorillonite, calcium montmorillonite, nontronite, bentonite, beidellite, hectorite, sodium hectorite, saponite, sauconite, fluorohectorite, stevensite, volkonskoite, magadiite, kenyaite, or smectite-type clay. The phyllosilicates as described above may be obtained in a natural state in the nature or synthesized by a known method in the related art.

In one example, the clay may be organic clay, which is organically modified. The organic clay refers to a smectite or smectite-type clay prepared by interaction of unfunctionalized clay with at least one intercalant. A kind of the intercalant used herein is generally a neutral or ionic organic compound. Here, the neutral organic compound may be a monomeric, oligomeric or polymeric compound of a polar compound such as an amide, ester, lactame, nitrile, urea, carbonate, phosphate, phosphonate, sulfate, sulfonate or nitro compound. The neutral organic compound may be inserted between clay layers through a hydrogen bond without completely replacing a charge balancing ion of clay. In addition, the ionic organic compound may be a cationic surfactant such as an onium compound such as primary, secondary, tertiary or quaternary ammonium, phosphonium, a sulfonium derivative, aromatic or aliphatic amine, phosphine or sulfide, or an onium ion such as a quaternary ammonium ion having at least one long-chain aliphatic group (e.g., octadecyl, myristyl or oleyl) binding to a quaternary nitrogen atom. The organic clays are commercially available under the trade names Cloisite (Southern Clay Product; induced from layered magnesium aluminum silicate), Claytone (Southern Clay Product; induced from natural sodium bentonite) and Nanomer (Nanocor).

A shape of the filler may be, but is not limited to, spherical, oval, polygonal or amorphous.

In addition, the filler may be subjected to a suitable grinding process before blended to the adhesive layer like the water absorbent.

As the filler, a product whose surface is treated with an organic material may be used to increase a binding efficiency with another organic material such as the curable resin.

The adhesive may include the filler at approximately 1 to 50, 1 to 40, 1 to 30, 1 to 20 or 1 to 15 parts by weight with respect to 100 parts by weight of the curable resin. As the content of the filler is controlled to 1 part by weight or more, a cured product having an excellent water and vapor blocking property and excellent mechanical properties may be provided. In addition, as the content of the filler is controlled to 50 parts by weight or less, the adhesive layer can be formed in the form of a film or sheet as to be described later. Even when the adhesive layer has a small thickness, the cured product in which the adhesive has an excellent water blocking property may be provided.

In addition, the adhesive layer may further include a curing agent capable of forming a crosslinking structure by a reaction with a curable resin or an initiator capable of initiating a curing reaction of the curable resin according to the kind of the curable resin.

A suitable kind of the curing agent may be properly selected and used according to a kind of the curable resin or a functional group included in the resin.

In one example, when the curable resin is an epoxy resin, the curing agent may be a curing agent of an epoxy resin known in the related art, which may be one or a mixture of at least two of an amine curing agent, an imidazole curing agent, a phenol curing agent, a phosphorous curing agent and an acid anhydride curing agent. However, the present application is not limited thereto.

In one example, the curing agent may be an imidazole compound which is solid at room temperature, and has a melting point or degradation temperature of 80° C. or more. Such a compound may be, but is not limited to, 2-methyl imidazole, 2-heptadecyl imidazole, 2-phenyl imidazole, 2-phenyl-4-methyl imidazole or 1-cyanoethyl-2-phenyl imidazole.

A content of the curing agent may be selected according to a kind or ratio of the curable resin. For example, the curing agent may be included at 1 to 20, 1 to 10 or 1 to 5 parts by weight with respect to 100 parts by weight of the curable resin. However, the weight ratio may be changed according to the kind and ratio of the curable resin or a functional group of the resin, or a crosslinking density to be realized.

When the curable resin is an epoxy resin capable of being cured by the radiation of active energy rays, as the initiator, a cationic photopolymerization initiator may be used.

As the cationic photopolymerization initiator, an onium salt- or organometallic salt-based ionic cationic initiator, or an organic silane- or latent sulfonic acid-based or non-ionic cationic photopolymerization initiator may be used. The onium salt-based initiator may be diaryliodonium salt, triarylsulfonium salt or aryldiazonium salt, the organometallic salt-based initiator may be iron arene, the organic silane-based initiator may be o-nitrobenzyl triaryl silyl ether, triaryl silyl peroxide or acyl silane, and the latent sulfonic acid-based initiator may be α-sulfonyloxy ketone or α-hydroxymethylbenzoin sulfonate. However, the present application is not limited thereto.

The cationic initiator is preferably an ionic cationic photopolymerization initiator, more preferably an onium salt-based ionic cationic photopolymerization initiator, and even more preferably an aromatic sulfonate-, for example, triacrylsulfonium salt-based ionic cationic photopolymerization initiator. However, the present application is not limited thereto.

Like the curing agent, a content of the initiator may be changed according to according to the kind and ratio of the curable resin or a functional group of the resin, or a crosslinking density to be realized. For example, the initiator may be blended at 0.01 to 10 or 0.1 to 3 parts by weight with respect to 100 parts by weight of the curable resin. When the content of the initiator is excessively low, sufficient curing may not be performed, and when the content of the initiator is excessively high, a content of the ionic material is increased after curing, and thus durability of the adhesive layer is decreased or a conjugate acid is formed due to characteristics of the initiator. Therefore, it is disadvantageous in optical durability, and corrosion may occur depending on a base. Accordingly, in consideration of these, a suitable range of the content may be selected.

The adhesive layer may further include a binder resin. The binder resin may serve to improve moldability when the adhesive layer is molded in the form of a film or sheet.

A kind of the binder resin is not particularly limited, if the binder resin has compatibility with another component such as the curable resin. The binder resin may be a phenoxy resin, an acrylate resin or a high molecular weight epoxy resin. Here, for example, the high molecular weight epoxy resin may refer to a resin having a weight average molecular weight of approximately 2,000 to 70,000. As the high molecular weight epoxy resin, a solid bisphenol A-type epoxy resin or solid bisphenol F-type epoxy resin may be used. As a binder resin, a rubber component such as rubber containing a high polarity functional group or reactive rubber containing a high polarity functional group may be used. In one example, as the binder resin, a phenoxy resin may be used.

When the binder resin is included, a ratio of the binder is not particularly limited, but may be controlled according to desired physical properties. For example, the binder resin may be included at approximately 200, 150 or 100 parts by weight or less with respect to 100 parts by weight of the curable resin. When the ratio of the binder reins is 200 parts by weight or less, the binder resin may effectively maintain compatibility with each component of the adhesive layer, and serve as an adhesive.

The adhesive may further include an additive such as a plasticizer, a UV stabilizer and/or an antioxidant within a range not affecting a desired effect.

The adhesive layer may be formed by preparing a coating solution by suitably blending necessary components of the above-described components, or dissolving or dispersing the necessary components in a solvent when necessary, and then coating the coating solution. In this operation, a content of the curable resin included in the coating solution may be suitably controlled according to desired water blocking property and film moldability. When a binder resin is included in the coating solution, a content of the binder resin may also be controlled in consideration of the film moldability and shock resistance.

When a filler is included in the coating solution, in terms of the enhancement of dispensability, a ball mill, bead mill, a 3-roll mill or a high-speed grinder may be used alone or in combination. As a material of the ball or bead, glass, alumina or zirconium may be used, and a ball or bead formed of zirconium may be preferable in terms of dispersibility of particles.

A kind of a solvent used to prepare the coating solution is not particularly limited. However, when a drying time of a solvent is excessively long, or high temperature drying is required, as a solvent having a volatile temperature of 100° C. or less is used, it can prevent problems occurring in terms of workability or durability of the adhesive film. In addition, in consideration of the film moldability, a small amount of a solvent having a volatile temperature in the above range or more may be mixed. The solvent may be, but is not limited to, one or a mixture of at least of methylethylketone (MEK), acetone, toluene, dimethylformamide (DMF), methylcellosolve (MCS), tetrahydrofuran (THF) and N-methylpyrrolidone (NMP).

A method of coating the coating solution is not particularly limited, and a known method such as knife coating, roll coating, spray coating, gravure coating, curtain coating, comma coating or lip coating may be used without limitation.

The adhesive layer may be formed by drying the coated coating solution. In this operation, the adhesive layer may be formed by drying and removing the solvent by heating the coated coating solution. Here, the drying condition is not particularly limited, and drying may be performed at 70 to 150° C. for 1 to 10 minutes.

The adhesive film may further include a suitable base or release film (hereinafter referred to as a "first film"), and have a structure in which the adhesive layer is formed on the first film. The first film may be a film having an embossment formed on a surface thereof, which is described above. The adhesive film may further include a base or release film (hereinafter referred to as a "second film") formed on the adhesive layer.

FIG. 5 shows that the adhesive layer 12 is formed between the two base or release films 41 and 51. However, the adhesive film shown in the drawing is merely an example. The adhesive film may only include an adhesive layer maintaining a solid or semi-solid phase at room temperature, not including a support base layer. Alternatively, in some cases, the adhesive film may be a double-sided adhesive film in which the adhesive layer is formed on both surfaces of one base or release film.

A specific kind of the first film is not particularly limited. The first film may be a polymer film generally used in the related art. The film may have an embossment, which is formed by the above-described method. For example, as the first film, a polyethyleneterephthalate film, a polytetrafluoroethylene film, a polyethylene film, a polypropylene film, a polybutene film, a polybutadiene film, a vinylchloride copolymer film, a polyurethane film, an ethylene-vinylacetate film, an ethylene-propylene copolymer film, an ethylene-acrylic acid ethyl copolymer film, an ethylene-acrylic acid methyl copolymer film or a polyimide film. Suitable releasing treatment may be performed on one or both surfaces of the first film. As a releasing agent used in the releasing treatment, an alkyd-, silicon-, fluorine-, unsaturated ester-, polyolefin- or wax-based releasing agent may be used, and in terms of thermal resistance, an alkyd-, silicon- or fluorine-based releasing agent is preferably used, but the present application is not limited thereto.

In addition, a kind of the second film (hereinafter referred to as a "cover film") is neither particularly limited. For example, the second film may be the same or different kind of the first film within the illustrative category of the first film described above. In addition, the second film may also be subjected to suitable releasing treatment.

A thickness of the base or release film is not particularly limited, and may be suitably selected according to use to be applied. For example, a thickness of the first film may be approximately 50 to 500 μm or 100 to 200 μm. In addition, a thickness of the second film may be set to be the same as the first film. Moreover, in consideration of processibility, the thickness of the second film may be set to be relatively smaller than the first film.

Another aspect of the present application provides a method of capsulating an OED. The illustrative method may include disposing a surface of an adhesive layer having a groove for exhausting air of an adhesive film to face an OED, and stacking the adhesive layer such that the surface covers an entire surface of the OED. Air bubbles captured in this operation may be exhausted through the groove for exhausting air, and a space formed by the groove may be eliminated due to the application of heat or pressure, thereby completely coating an entire surface of the OED with the adhesive layer.

FIG. 6 is a diagram showing an illustrative OED capsulated 6 in the above manner. The OED may be manufactured by forming a transparent electrode on glass or a polymer film used as a substrate 61, 62 by a method such as vacuum deposition or sputtering, forming an OED 63, for example, an OLED layer including a hole transport layer, an emitting layer and an electron transport layer on the transparent electrode, forming an electrode layer on the OED 63 and capsulating the OED 63 with the adhesive film described above.

The method may include a method of forming a transparent electrode on a substrate such as glass or a polymer film using vacuum deposition or sputtering and forming an organic material layer on the transparent electrode. The organic material layer may include a hole injection layer, a hole transport layer, an emitting layer, an electron injection layer and/or an electron transport layer. Subsequently, a second electrode may be further formed on the organic material layer, the surface of the adhesive layer having the groove for exhausting air in the adhesive film is disposed on the substrate to face the OED, and the adhesive film may be applied to cover the entire surface of the OED.

A method of applying the adhesive film is not particularly limited, and the substrate (e.g., glass or polymer film) to which the adhesive layer is previously transferred may be applied to a top surface of the OED by heating or compression. Here, when the adhesive film is transferred, a base or release film formed on the film was peeled off, and the adhesive film may be transferred on a substrate using a vacuum press or vacuum laminator with supplying heat using the above-described adhesive film. In this operation, when a curing reaction of the adhesive film is performed in a certain range or more, a cohesive or adhesive strength of the adhesive film may be probably decreased. Therefore, a process temperature may be controlled to approximately 100° C. or less, and a process time may be controlled within 5 minutes. Similarly, even when the substrate to which the adhesive film is transferred is heat-compressed to the OED, a vacuum press or vacuum laminator may be used. In this operation, subsequently, a capsulated structure may be formed by curing the adhesive layer. The curing process of the adhesive layer may be performed in a heat chamber or UV chamber. Before or after the curing process, or when simultaneously necessary, a suitable pressure may be applied to remove captured air bubbles, and the groove may be eliminated. A heating condition during curing or a condition for radiating electromagnetic waves may be suitably selected in consideration of stability of the OED and curability of the resin.

For example, the surface of the adhesive layer not having a groove for exhausting air is previously attached to a capsulation material such as glass or metal by a lamination process, and vacuum-laminated to the substrate on which the OED is formed in the form of a layer at approximately 40 to 100° C. Thereby, air bubbles captured in the stacking operation may be suitably exhausted through the groove for exhausting air, and the space formed by the groove may be filled, and thus a device having excellent durability may be manufactured.

The above-described manufacturing process is merely an aspect to manufacture the OED, and thus the process sequence or condition may be freely changed. For example, the sequence of the compressing and encapsulating processes may be changed into a sequence of first transferring the adhesive film to the OED on the substrate and then compressing a cover substrate.

Still another aspect of the present application provides an OED capsulated with the adhesive film. An illustrative OED may include an OED encapsulated with the adhesive film. In one example, here, an entire surface of the OED may be coated by a surface of the adhesive layer having a groove for exhausting air.

In one example, the OED may include a substrate and an OED formed on the substrate, and the OED may be encapsulated or capsulated with the adhesive film. The OED may further include a cover substrate on a top surface thereof. The OED may be an OLED. The adhesive film may have an excellent water blocking property and an excellent optical property, and serve as an adhesive for a structure fixing and supporting the substrate and the cover substrate, thereby providing an encapsulation layer.

In addition, the adhesive film may be effectively applied to an OED designed in a top emission or bottom emission mode due to excellent transparency.

Effect

An illustrative adhesive film can be applied to capsulation of an OED, thereby effectively removing air bubbles captured during the capsulation and finally realizing a capsulated structure having excellent durability.

Figure 1:
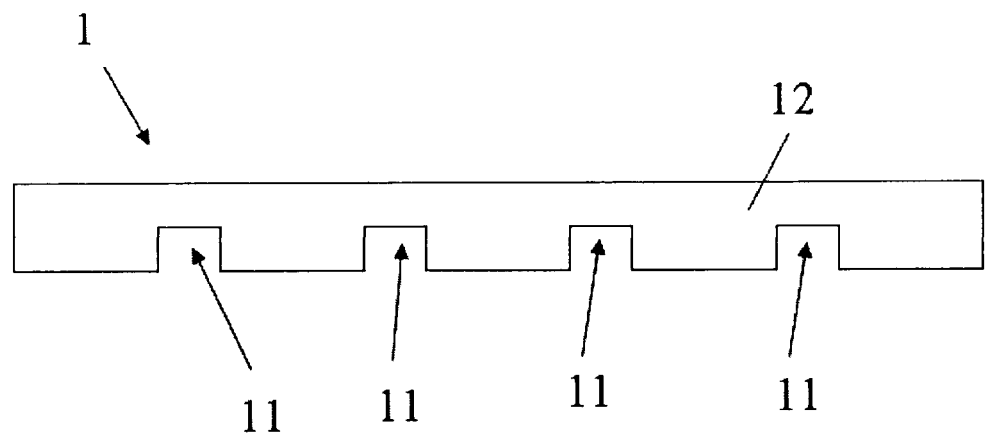
FIGS. 1 to 5 are diagrams of an illustrative adhesive film.
Figure 2:
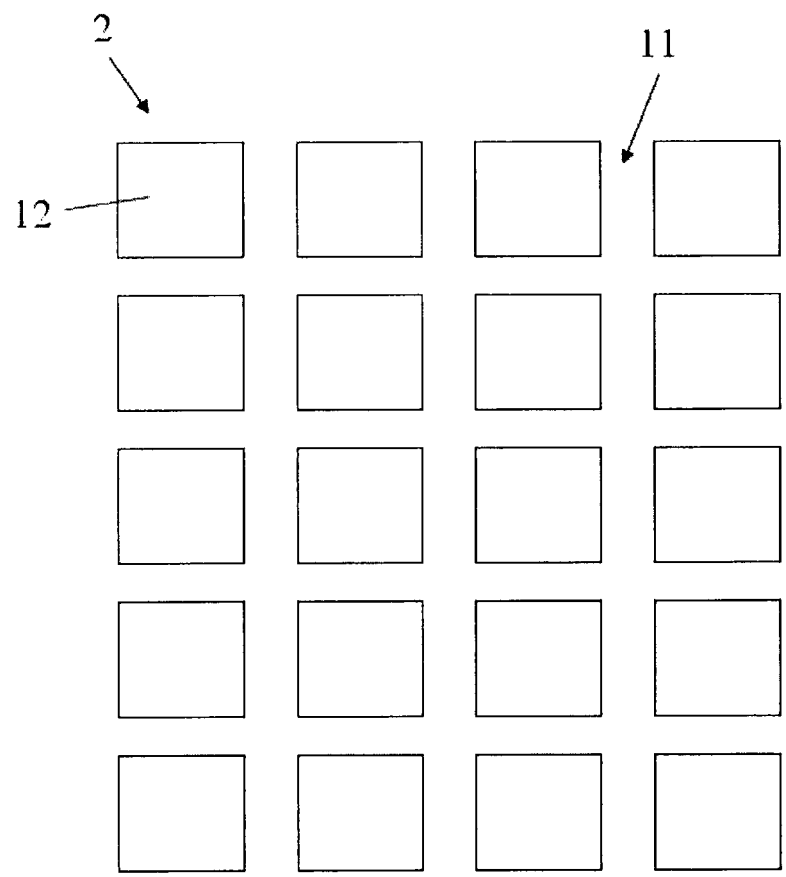
Figure 3:
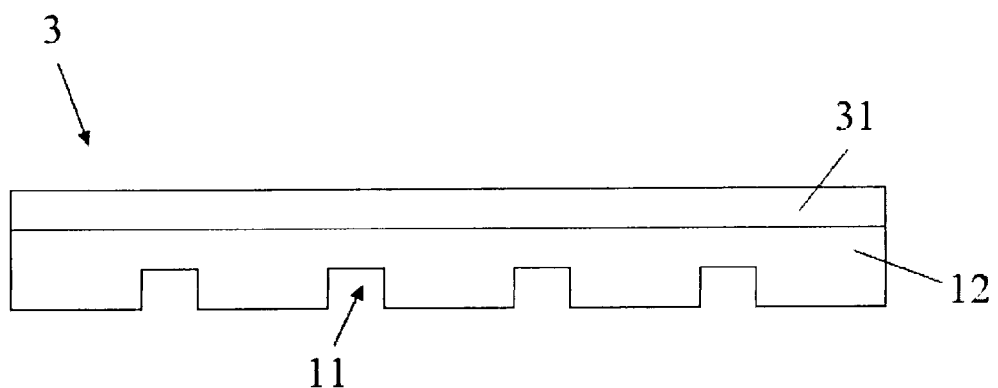

BRIEF DESCRIPTION OF THE SEVERAL VIEWS OF THE DRAWINGS 1, 2, 3, 4, 5: adhesive film
11: groove
12, 31: adhesive layer
41: embossed form
42, 51: base or release film
6: capsulated OED
61, 62: substrate
63: OED

ILLUSTRATIVE EMBODIMENTS

Hereinafter, the present application will be described in further detail with reference to Examples according to the present application and Comparative Examples not according to the present application, but the scope of the present application is not limited to the following Examples.

1. Evaluation of Adhesive Strength

Two 0.7 T glass plates were crossed to be disposed in a T shape, and an adhesive layer having a size of 5 mm×40 mm (width×length) formed in Example or Comparative Example was located on a contact site of the two plates. Subsequently, the resulting plates were heat-compressed at 80° C. for 2 minutes at 2 kgf in a vacuum, and cured at 100° C. for 3 hours. Afterward, a strength at the time in which the attached glass specimen is separated was measured using a tensile tester while an end of the T-shaped glass specimen was pressed at a constant pressure, and then the strength was defined as an adhesive strength.

2. Calcium Test

Calcium (Ca) was deposited in a size of 8 mm×8 min×100 nm (width×length×thickness) on a glass substrate. Subsequently, an encapsulation layer was formed by laminating a cover glass to which the adhesive layer formed in Example or Comparative Example was transferred on the calcium of the glass substrate so that a bezel had a size of 3 mm, heat-compressing the cover glass at 80° C. for 2 minutes using a vacuum press and curing the resulting glass at 100° C. for 3 hours, thereby forming a specimen. Afterward, the specimen was maintained in a constant temperature and constant humidity chamber in which a temperature was 80° C. and a relative humidity was 90%, and a time at which an end of the calcium-deposited part became transparent by oxidation was measured.

3. Evaluation of Exhausting Property of Air Bubbles

A surface of an adhesive film previously formed, which did not have a groove for exhausting air was thermal-laminated to glass having a size of 20 cm×20 cm (width×length), and a surface of an adhesive film having a groove for exhausting air was stacked on another glass to coat an entire surface thereof. The two glasses were heat-compressed at 80° C. for 2 minutes under a pressure of 2 kgf in a vacuum, and cured at 100° C. for 3 hours. Afterward, an exhausting property of air bubbles was evaluated according to the following criteria:

<Criteria for Evaluating Exhausting Property of Air Bubbles>

○: Captured air bubbles were not observed with the naked eye.

Δ: A small amount of captured air bubbles were observed with the naked eye.

x: A large amount of captured air bubbles were observed with the naked eye.

Example 1

Preparation of Coating Solution

A filler solution was prepared by adding 18 g of nanoclay (Southern Clay Products; Cloisite 93A) as a filler to methylethylketone at 30 wt %. Subsequently, the solution was subjected to a ball mill process to mill the solution for approximately 24 hours. At room temperature, 200 g of an epoxy resin (YD-128, Kukdo Chemical Co., Ltd.) and 150 g of a phenoxy resin (YP-50, Tohto Kasei Co., Ltd.) were put into a reactor, and diluted with methylethylketone to a suitable concentration. An inside of the reactor was substituted with nitrogen, and the solution was homogenized. The water absorbent and filler solution subjected to the ball mill process were put into the homogenized solution, 4 g of an imidazole curing agent (Shikoku Chemicals Co., Ltd.) was added thereto, and the resulting solution was stirred at a high speed for 1 hour. The stirred solution was filtrated using a filter having a hole size of 20 μm, thereby preparing a coating solution.

Formation of Adhesive Film

Figure 4:
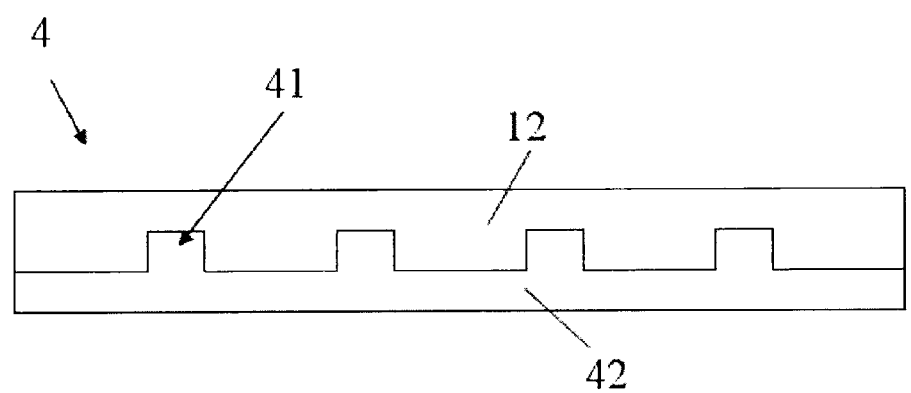
Figure 5:
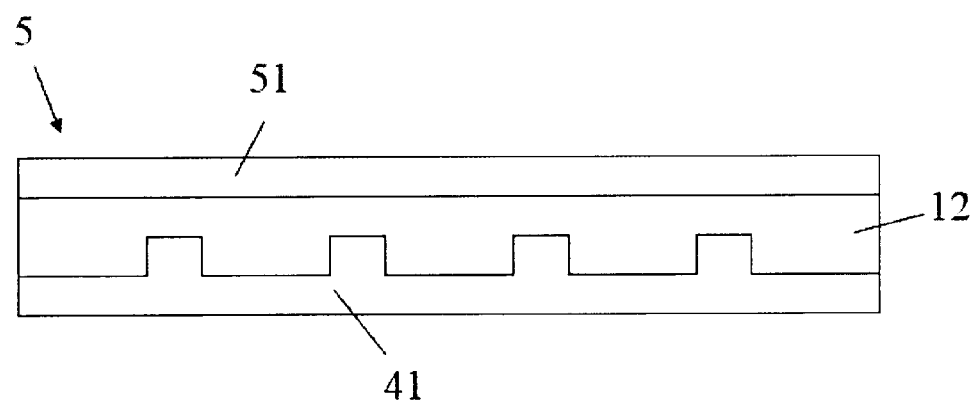
Figure 6:
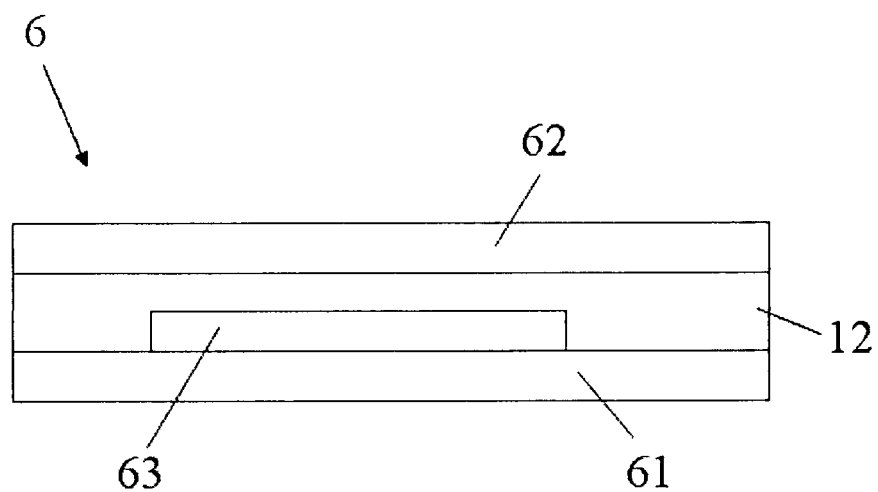
FIG. 6 is a diagram of an illustrative OED.

The coating solution was coated on a release film, which was prepared by an embossing process and in which embossments having a height of approximately 5 μm and a width of approximately 100 μm were formed at an interval of approximately 500 μm to cover an entire surface of the release film, using a comma coater. The heights, widths and intervals of the embossments on the surface of the release film were measured using a surface roughness tester, SURFTEST 301 produced by Mitutoyo, after the release film was fixed on a flat glass plate. The coated coating solution was dried in a drier at 120° C. for 5 minutes, thereby forming an adhesive layer having a thickness of approximately 20 μm and maintained in a solid phase at room temperature. The formed adhesive layer was laminated to a release film formed of the same material as the release film using a laminator, thereby forming a release film having the structure shown in FIG. 4.

Example 2

Preparation of Coating Solution

A filler solution was prepared by adding 10 g of nanoclay (Southern Clay Products; Cloisite 93A) as a filler to methylethylketone at 30 wt %. Subsequently, the solution was subjected to a ball mill process to mill the solution for approximately 24 hours. At room temperature, 200 g of an epoxy resin (YD-128, Kukdo Chemical Co., Ltd.) and 150 g of a phenoxy resin (YP-50, Tohto Kasei Co., Ltd.) were put into a reactor, and diluted with methylethylketone. An inside of the reactor was substituted with nitrogen, and the solution was homogenized. The water absorbent and filler solution subjected to the mill process were put into the homogenized solution, 4 g of an imidazole curing agent (Shikoku Chemicals Co., Ltd.) was added thereto, and the resulting solution was stirred at a high speed for 1 hour. The stirred solution was filtrated using a filter having a hole size of 20 μm, thereby preparing a coating solution by the same method as described in Example 1.

Formation of Adhesive Film

The coating solution was coated on a release film, which was prepared by an embossing process and in which embossments having a height of approximately 1 μm and a width of approximately 50 μm were formed at an interval of approximately 1 mm to cover an entire surface of the release film, using a comma coater. The heights, widths and intervals of the embossments on the surface of the release film were measured using a surface roughness tester, SURFTEST 301 produced by Mitutoyo, after the release film was fixed on a flat glass plate. The coated coating solution was dried in a drier at 120° C. for 5 minutes, thereby forming an adhesive layer having a thickness of approximately 20 μm and maintained in a solid phase at room temperature. The formed adhesive layer was laminated to a release film formed of the same material as the release film using a laminator, thereby forming a release film having the structure shown in FIG. 4.

Comparative Example 1

An adhesive film was formed as described in Example 1, except that a release film having a flat surface without having an embossment formed on a surface thereof was used.

Comparative Example 2

An adhesive film was formed as described in Example 1, except that a release film, which was prepared by an embossing process and in which embossments having a height of approximately 15 μm and a width of approximately 50 μm were formed at an interval of approximately 5 mm to cover an entire surface of the release film, was used.

The measured results are summarized in Table 1.

TABLE 1

| | Adhesive Strength (gf/cm2) | Ca Test Results | Exhausting Property of Air Bubbles |
|---|---|---|---|
| Example 1 | 600 | 400 hrs | ○ |
| Example 2 | 700 | 340 hrs | ○ |
| Comparative Example 1 | 600 | 260 hrs | Δ |
| Comparative Example 2 | 400 | 100 hrs | X |

What is claimed is:

1. An adhesive film for capsulating an organic electronic device, which comprises an adhesive layer, on the surface of which at least one groove for exhausting air having a width of 20 μm to 1 mm and a height of 1 to 10 μm is formed,
    wherein the adhesive layer has a multi-layered structure, and a groove for exhausting air is formed on a surface of the outermost adhesive layer of the multi-layered adhesive layer.

2. The adhesive film for capsulating the organic electronic device according to claim 1, wherein a plurality of grooves for exhausting air are formed on a surface of the adhesive layer, and an average gap between the plurality of grooves for exhausting air is from 100 μm to 5 mm.

3. The adhesive film for capsulating the organic electronic device according to claim 1, wherein a first groove for exhausting air having a width of 20 μm to 1 mm and a height of 1 to 10 μm and a second groove for exhausting air connected with the first groove for exhausting air and having a higher width or height than the first groove for exhausting air.

4. The adhesive film for capsulating the organic electronic device according to claim 3, wherein at least two of the first grooves for exhausting air and at least two of the second grooves for exhausting air are formed on a surface of the adhesive layer, a gap between the second grooves for exhausting air is larger than a gap between the first grooves for exhausting air, and the first groove for exhausting air is formed between adjacent two of the second grooves for exhausting air.

5. The adhesive film for capsulating the organic electronic device according to claim 1, wherein the adhesive layer has a viscosity at room temperature of $10^6$ to $10^9$ dyne/cm$^2$.

6. The adhesive film for capsulating the organic electronic device according to claim 1, wherein the adhesive layer is formed of an adhesive including a curable resin.

7. The adhesive film for capsulating the organic electronic device according to claim 6, wherein the curable resin is a heat-curable, photocurable or hybrid-curable resin.

8. The adhesive film for capsulating the organic electronic device according to claim 1, wherein the adhesive layer includes a water absorbent.

9. The adhesive film for capsulating the organic electronic device according to claim 8, wherein the adhesive layer further includes at least one filler selected from clay, talc, silica, zeolite, zirconia, titania and montmorillonite.

10. The adhesive film for capsulating the organic electronic device according to claim 6, wherein the adhesive layer further includes at least one selected from the group consisting of a curing agent, an initiator and a binder resin.

11. The adhesive film for capsulating the organic electronic device according to claim 1, wherein only layers of the multi-layered adhesive layer not having a groove for exhausting air include a water absorbent.

* * * * *